United States Patent [19]

Leinkram et al.

[11] 3,769,091

[45] Oct. 30, 1973

[54] SHINGLED ARRAY OF SOLAR CELLS

[75] Inventors: Charles Z. Leinkram, Bowie, Md.; William D. Oaks, Midland, Va.

[73] Assignee: The United States of America as represented by the Secretary of the Navy, Washington, D.C.

[22] Filed: Mar. 31, 1972

[21] Appl. No.: 239,869

[52] U.S. Cl. .......... 136/89, 29/572

[51] Int. Cl. .......... H01l 15/02

[58] Field of Search .......... 136/89

[56] References Cited

UNITED STATES PATENTS

| | | | |
|---|---|---|---|
| 3,152,774 | 10/1964 | Wyatt | 136/89 UX |
| 3,330,700 | 7/1967 | Golub et al. | 136/89 |
| 3,346,419 | 10/1967 | Webb | 136/89 |
| 3,418,170 | 12/1968 | Amsterdam et al. | 136/89 |
| 3,433,676 | 3/1969 | Stein | 136/89 |

*Primary Examiner*—A. B. Curtis
*Attorney*—R. S. Sciascia et al.

[57] ABSTRACT

A method of mounting solar cells in an array, and a solar cell array, in which the cells are arranged on thermally conductive but electrically insulative wafer and prominences so that they overlap each other in a shingled structure but their bottom surfaces are supported and remain parallel to the top surface of the mounting wafer, the array structure permitting series wiring of the cells and providing a rugged structure having a thermally conductive path from the solar cells through the mounting elements.

8 Claims, 6 Drawing Figures

SHINGLED ARRAY OF SOLAR CELLS

BACKGROUND OF THE INVENTION

This invention relates to a method for assembling, and an array of, solar cells and especially to a mounting method providing a shingled structure which gives a large increase in the thermal dissipation capacity and the ruggedness of the solar cell array.

Prior to this invention, the silicon cells in a solar cell assembly or array for powering an earth-circling satellite were mounted on the aluminum panel of the satellite according to the following sequence:

1. A five-mil layer of fiberglass was secured to the aluminum panel by means of epoxy;
2. The cell array was then secured to the fiberglass layer by either a silicon adhesive or an epoxy.

The cells were arranged in an overlapping or shingled structure. The entire array suffered from the poor thermal conductivity of both the fiberglass and the epoxy mounting adhesive. In addition, because of the different thermal coefficients of linear expansion of the aluminum, fiberglass, epoxy and silicon, high mechanical stresses occured and potential failure modes existed.

The present invention provides an excellent thermal path between the panel and the cells, minimizes or eliminates the potential failure mode caused by the linear thermal expansion mismatch and makes the cell array more rugged so that breakages are minimized.

SUMMARY OF THE INVENTION

The objects and advantages of the present invention are accomplished by mounting the solar cells in a series of steps on a wafer and a number of stepped, spaced platens. The waver and platens are made of thermally conductive, electrically insulative material. The platens and wafer are metallized on top and bottom surfaces with thermally and electrically conductive material. The metallized abutting surfaces of the cells, wafer and platens are then soldered together. Ruggedness is increased by overlapping the solar cells while supporting them by the platens.

OBJECTS OF THE INVENTION

An object of the invention is to provide a rugged solar cell array with high termal conductivity.

Another object is to provide a solar cell array in which stresses due to mismatch of coefficients of linear thermal expansion of the various components are alleviated so that breakage from this cause is minimized or eliminated.

A further object is to provide a solar cell array with a shingled structure in which the linear packing density is not increased over present array structures.

Other objects, advantages and novel features of the invention will become apparent from the following detailed description of the invention when considered in conjunction with the accompanying drawings wherein:

DETAILED DESCRIPTION

Figures 1, 2A, 2B, 3, 4, 5:
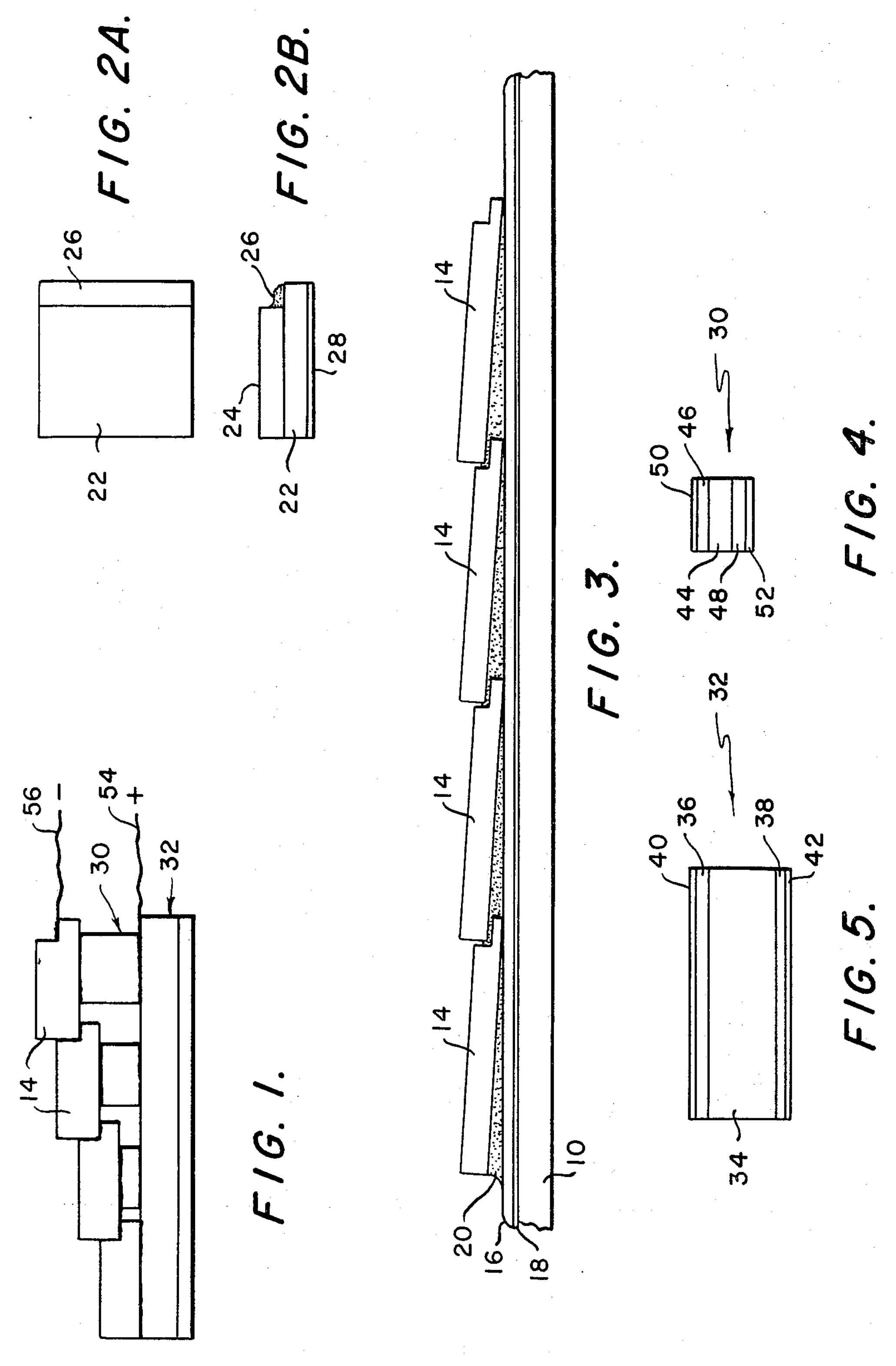
FIG. 1 is a schematic illustration of the structure of a solar cell array fabricated in accordance with the invention.
FIG. 2A is a schematic illustration in top view of a silicon solar cell.
FIG. 2B is a schematic illustration in side view of a silicon solar cell.
FIG. 3 is a schematic illustration of the structure of a current solar cell array.
FIG. 4 is a schematic illustration of a metallized platen or prominence.
FIG. 5 is a schematic illustration of a metallized wafer.

FIG. 3 shows the current method for assembling a silicon solar cell array. On an aluminum panel 10, which may be the outer skin of an earth-circling satellite, for example, a plurality of silicon solar cells 14 are mounted in an overlapping or shingled arrangement. It is to be noted that all the lower surfaces of the cells 14 are at an angle to the upper surface of the panel 10. A layer 16 of a fiberglass-epoxy composite is bonded to the panel 10 by an adhesive 18, either silicon or epoxy, and the cells 14 are cemented to the fiberglass-epoxy layer 16 by a bonding adhesive layer 20, either of silicon or epoxy.

The adhesive layers and the fiberglass layer are not good thermal conductors, so that a good thermal path between the cells 14 and the aluminum panel 10 does not exist. This leads to excessive heating of the solar cells which deteriorates them, lowering their voltage. Also the array is extremely fragile and a high amount of breakage occurs.

FIGS. 2A and 2B show the structure of a silicon solar cell 14 in plane and side views. A cover glass 24 sets on top of a square plate 22 comprising layers of p- and n-type silicon. A small strip at one end of the square plate 22 is left uncovered by the glass and this forms a step which is tinned with solder 26, preferably a silver-lead eutectic solder. The bottom surface of the silicon cell is tinned with a layer 28 of silver-titanium alloy for soldering purposes. The dimensions of each cell 14 are 2 cm × 2 cm (but, of course, the cells can be built to any desired dimensions).

FIG. 1 indicates how an array is assembled in accordance with the present invention. An electrically insulative, thermally conductive wafer 32, comprising a central portion 34 preferably of beryllium oxide (BeO) ceramic, such as National Beryllium Co.'s type K 150, constitutes the mounting base for the solar cells 14. The wafer 32 is metallized on top and bottom surfaces with layers of metal 36 and 38 such that the final plating is a layer of copper of approximately 0.5-1 mil thickness. The initially deposited layer may be of chromium which adheres to beryllia better than copper does. The layers of copper are then covered with layers 40 and 42 of a tin-lead eutectic solder.

The first solar cell 14 is placed directly upon the top surface of the wafer 32. The other cells 14 are placed on a series of spaced platens or prominences 30 which gradually increase in height so that the bottom surface of each cell 14 fits into the step in the corner of the cell at its left, the steps being located at the right side of each cell. This results in a shingled or overlapping structure in which each cell except the first rests on another cell and on one platen 30, with the bottom surfaces of the cells being parallel to the top surface of the wafer 32. The height of each succeeding platen is increased by 0.012 inches, which is the height of the step in each cell.

The structure of each platen 30 is shown in FIG. 4. The central portion 44 is of a thermally conductive, electrically insulative material, preferably beryllium oxide ceramic. The top and bottom surfaces are coated with metallic layers 46 and 48 ending up with a copper plating layer between 0.5 and 1.0 mil in thickness, as was done with the wafer 32. On top of the copper layers 46 and 48, there are, respectively, layers 50 and 52 of solder, preferably a tin-lead eutectic alloy.

The steps in the process of assembling a solar cell array according to the invention comprise:

1. Starting with the beryllium oxide material, make a series of platens approximately 0.700 inches × 0.700 inches × 0.012 inches, 0.700 inches × 0.700 inches × 0.024 inches, 0.700 inches × 0.700 inches × 0.036 inches.

2. Metallize both sides of the platens ending up with a copper plate or layer on each side between 0.5 and 1.0 mil thick.

3. Tin both sides of the platens with a tin-lead eutectic solder.

4. Starting with a beryllium oxide wafer of 3 inches × 0.900 inches, again metallize both sides such that the final plating is copper approximately 0.5 to b 1.0 mil thick.

5. Tin one side of the beryllia wafer with tin-lead eutectic solder.

6. Place the beryllia wafer tinned-side up in a suitable jig.

7. Position the pretinned beryllia platens and first silicon cell into the jig.

8. Position the remaining cells on top of the pretinned platens such that the bottom of one cell rests in the pretinned corner or step of the preceding cell (the cell at its left), the first cell at the extreme left resting on the beryllia wafer itself, the heights of the platens increasing to the right.

9. Position weights on top of the cells and heat to approximately 200 degrees centigrade so that the solder flows.

10. Cool and remove the assembled solar cell array.

A wire lead 54 is now soldered to the copper plate 36 on top of the beryllia wafer at the right side to form the positive lead of the array and another wire lead 56 is soldered to the tinned portion of the step of the extreme right cell to form the negative lead. The beryllia wafer assembly is then mounted to the aluminum chassis panel of the satellite by indium solder to complete the panel mounting.

It is apparent of course that the array is not limited to only four cells and that the dimensions stem from the dimension of the silicon cells and the number of silicon cells to be employed.

The advantages of the invention include:

1. Better thermal conductivity between cell and panel calculated as being 49,000 BTU for the old array.

2. Matching of the coefficients of thermal expansion between the wafer and the silicon solar cell (beryllia and silicon have substantially the same coefficient, based on published data).

3. No decrease in linear packing density over the old array.

4. Electrical insulation between cells and cell arrays is maintained.

5. Cell efficiency is increased due to better dissipation of heat, thus providing more available power per cell.

Obviously many modifications and variations of the present invention are possible in light of the above teachings. It is therefore to be understood that within the scope of the appended claims the invention may be practiced otherwise than as specifically described.

What is claimed and desired to be secured by letters patent of the United States is:

1. An array of solar cells which provides good thermal conductivity comprising, in combination:

a metallized wafer formed from a material having good thermal conductivity and electrical insulativity, said material having its top and bottom surfaces each coated with an inner layer of metal and an outer layer of solder;

a plurality of platens formed from a material having good thermal conductivity and electrical insulativity, the top and bottom surfaces of said platens being metallized in the same manner as said wafer surfaces, said platens increasing in height by steps which equal the thickness of the step at one edge of each solar cell, the first platen's height being just equal to the thickness of said step; and a plurality of solar cells, the number being one more than the number of said platens, the first solar cell being set at the extreme left side of the top surface of said metallized wafer, the platens being set on said top surface of said wafer at spaced intervals to the right of said first cell in order of increasing height, a different solar cell being set on top of each platen with its left side fitting into the step in the corner of the solar cell at its left side so that a stepped, shingled configuration of cells is formed with their bottom surfaces parallel to the top surface of said wafer, the cells, platens and wafer then being soldered to each other.

2. An array as in claim 1, wherein said wafer and platens are formed from beryllium oxide.

3. An array as in claim 1, wherein said inner layer of metal consists mainly of copper coated on a thin coating of chromium.

4. An array as in claim 1, wherein said solder coatings are of a tin-lead eutectic alloy.

5. An array as in claim 1, further including a first wire lead soldered to the step of the solar cell at the extreme right side of said array and a second wire lead soldered to the top surface of said wafer.

6. The combination comprising:

a metallic mounting panel; and a solar cell array comprising:

a metallized wafer formed from a material having good thermal conductivity and electrical insulativity, said material having its top and bottom surfaces each coated with an inner layer of metal and an outer layer of solder, a plurality of platens formed from a material having good thermal conductivity and electrical insulativity, the top and bottom surfaces of said platens being metallized in the same manner as said wafer surfaces, said platens increasing in height by steps which equal the thickness of the step at one edge of each solar cell, the first platen's height being just equal to the thickness of said step, and a plurality of solar cells, the number being one more than the number of said platens, the first solar cell being set at the extreme left side of the top surface of said metallized wafer, the platens being set on said top surface of said wafer at spaced intervals to the right of said first cell in order of increasing height, a different solar cell being set on top of each platen with its left side fitting into the step in the corner of the solar cell at its left so that a stepped, shingled configuration of cells is formed with their bottom surfaces parallel to the top surface of said wafer, the cells, platens and wafer then being soldered to each other, the bottom surface of said wafer than being set upon and soldered to the surface of said mounting panel.

7. The combination of claim 6, wherein said wafer and platens are formed from beryllium oxide.

8. The combination of claim 7, wherein said inner layer of metal consists mainly of copper coated on a thin coating of chromium.

* * * * *